United States Patent [19]

Coller

[11] 4,083,101

[45] Apr. 11, 1978

[54] TOOL FOR INSTALLING INDIVIDUAL PINS IN PRINTED CIRCUIT BOARD

[75] Inventor: James Ray Coller, Mechanicsburg, Pa.

[73] Assignee: AMP Incorporated, Harrisburg, Pa.

[21] Appl. No.: 754,307

[22] Filed: Dec. 27, 1976

[51] Int. Cl.[2] .............................................. H05K 3/30

[52] U.S. Cl. ........................................ 29/739; 29/278; 29/758

[58] Field of Search ................. 29/739, 747, 750, 752, 29/758, 764, 278

[56] References Cited

U.S. PATENT DOCUMENTS

| | | | |
|---|---|---|---|
| 1,439,530 | 12/1922 | Schermerhorn et al. | 29/278 X |
| 3,257,713 | 6/1966 | Floyd, Jr. | 29/752 |
| 3,621,555 | 11/1971 | Cowmeadow | 29/764 X |
| 3,769,679 | 11/1973 | Kendall | 29/739 X |

*Primary Examiner*—Carl E. Hall

*Attorney, Agent, or Firm*—Donald W. Phillion

[57] ABSTRACT

A tool set for installing and removing individual connector pins mounted in an electrical circuit board and the like and within a connector housing wherein the pin to be removed or installed is part of a row of pin pairs enclosed within a housing. A pin is installed and/or removed with the present tools without housing removal or disturbing of other pins within the housing, regardless of the type of pin damage encountered. There is also a tool for inserting tie pins in a circuit board in aligned relationship.

2 Claims, 20 Drawing Figures

1
7
3

5
10
9
11
13

15
14
17
19
21

20
23
29
25
26
27
71
31

Fig 17
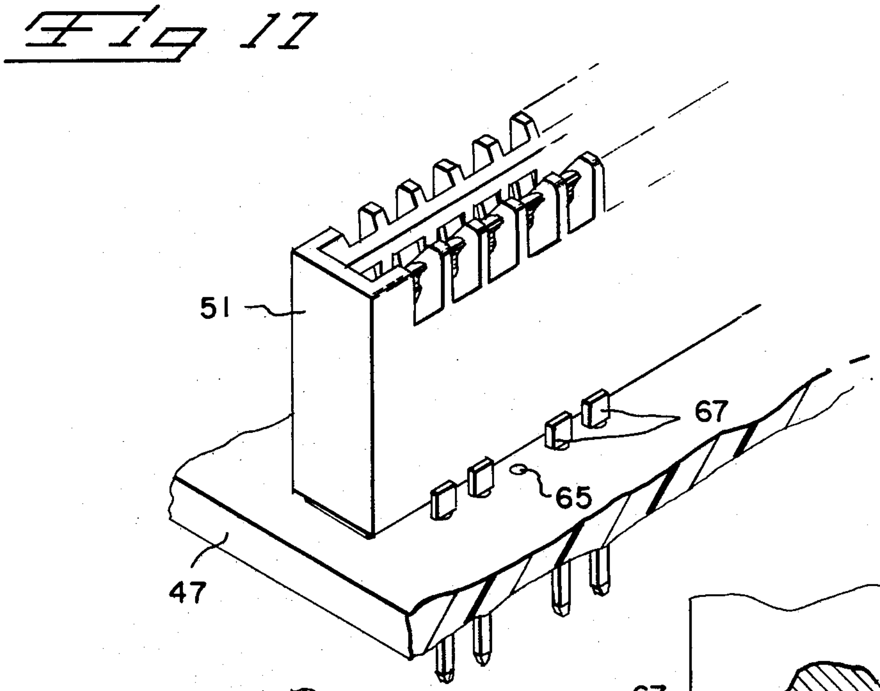
Fig 18
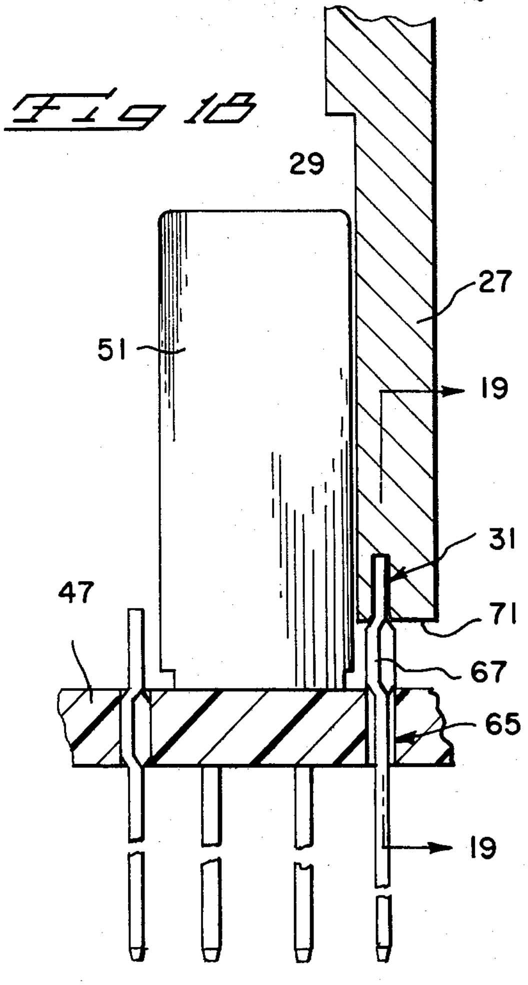
Fig 19
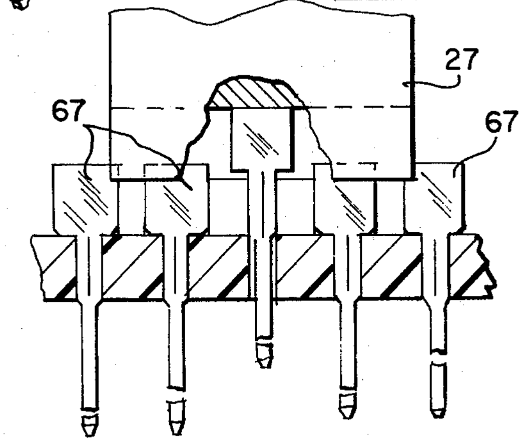
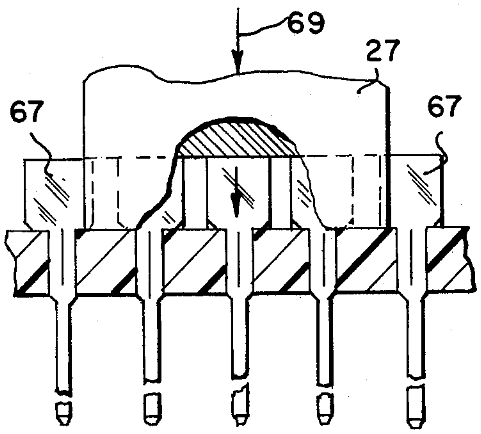
Fig 20

TOOL FOR INSTALLING INDIVIDUAL PINS IN PRINTED CIRCUIT BOARD

This invention relates to a tool set for installing and extracting individual pins from a row of pin pairs enclosed within a housing and, more specifically, to a tool set for extracting individual pins from an electrical connector of the type shown in Patent application Ser. No. 682,921 filed May 4, 1976.

A very common type of electrical connector involves the installation of individual contact member pairs into apertures in printed circuit boards and the like, whereby the contact member pairs are formed in rows. In order to make electrical connection with the contact member pairs, it is necessary to have a housing associated with the row of connector pairs for holding and securing to a housing member from a mating connector member. The housing in this case is preferably disposed over the contact members and is not rigidly connected thereto but is merely held in place by frictional forces and rests on or over the printed circuit board without being secured thereto. An electrical connector of this type is shown in patent application Ser. No. 682,921 filed May 4, 1976. Often, in electrical connectors of this type, individual pins break or are damaged by bending or the like and must be removed in the field. In accordance with the prior art, this was not easily accomplished without removal of the housing and then the use of individual tools for various types of pin breakage and pin damage. This was cumbersome, time consuming and required that a field repair man carry a great number of tools.

In accordance with the present invention, electrical connectors of the above described type can have broken and/or damaged pins extracted and new pins installed in the field, easily and without disassembling the connector itself. Briefly, this is accomplished by use of an impact tool having permanent or replaceable tips for removing damaged pins upwardly from the printed circuit board in which they are mounted and for a special insertion tool which is capable of inserting connector pins into the housing and printed circuit board without damage to the connector pin during installation. The impact tool tips include a tip for use where a pin breaks off flush with the bottom of a printed circuit board, a tip for use when the damage takes place above the printed circuit board but the portion of the pin depending from the circuit board is intact, a tip for use when a portion of the pin extending below the printed circuit remains but not enough for use with the above described tip, a tool for aligning all tie point pins during installation of a further tie point pin in a row of such pins and a specially designed pin insertion tool for easy insertion of pins through the housing and into a printed circuit board with minimal pin damage during pin installation.

It is therefore an object of this invention to provide tools for extracting and installing individual pins from an electrical connector housing in the field which minimize the degree of labor skill required and also minimize installation and removal time.

It is a further object of this invention to provide a pin extracting tool assembly capable of extracting pins from a printed circuit board through a housing with maximum speed and minimal connector damage.

It is a yet further object of this invention to provide a tool assembly for extraction of pins from an electrical connector housing which minimizes the tool complement required for all possible extraction operations.

The above objects and still further objects of the invention will immediately become apparent to those skilled in the art after consideration of the following preferred embodiments thereof, which are provided by way of examples and not by way of limitations wherein:

FIG. 17 is a perspective view of an electrical connector on a printed circuit board showing tie point pins adjacent the connector mounted in the printed circuit board;

FIG. 18 is a side view, partially in section of tie pin installation in process utilizing the tool of FIG. 5;

FIG. 19 is a view taken along the line 19—19 of FIG. 18; and

FIG. 20 is a view as in FIG. 19 with the tie pin completely inserted.

Figures 1, 2, 3, 4, 5:
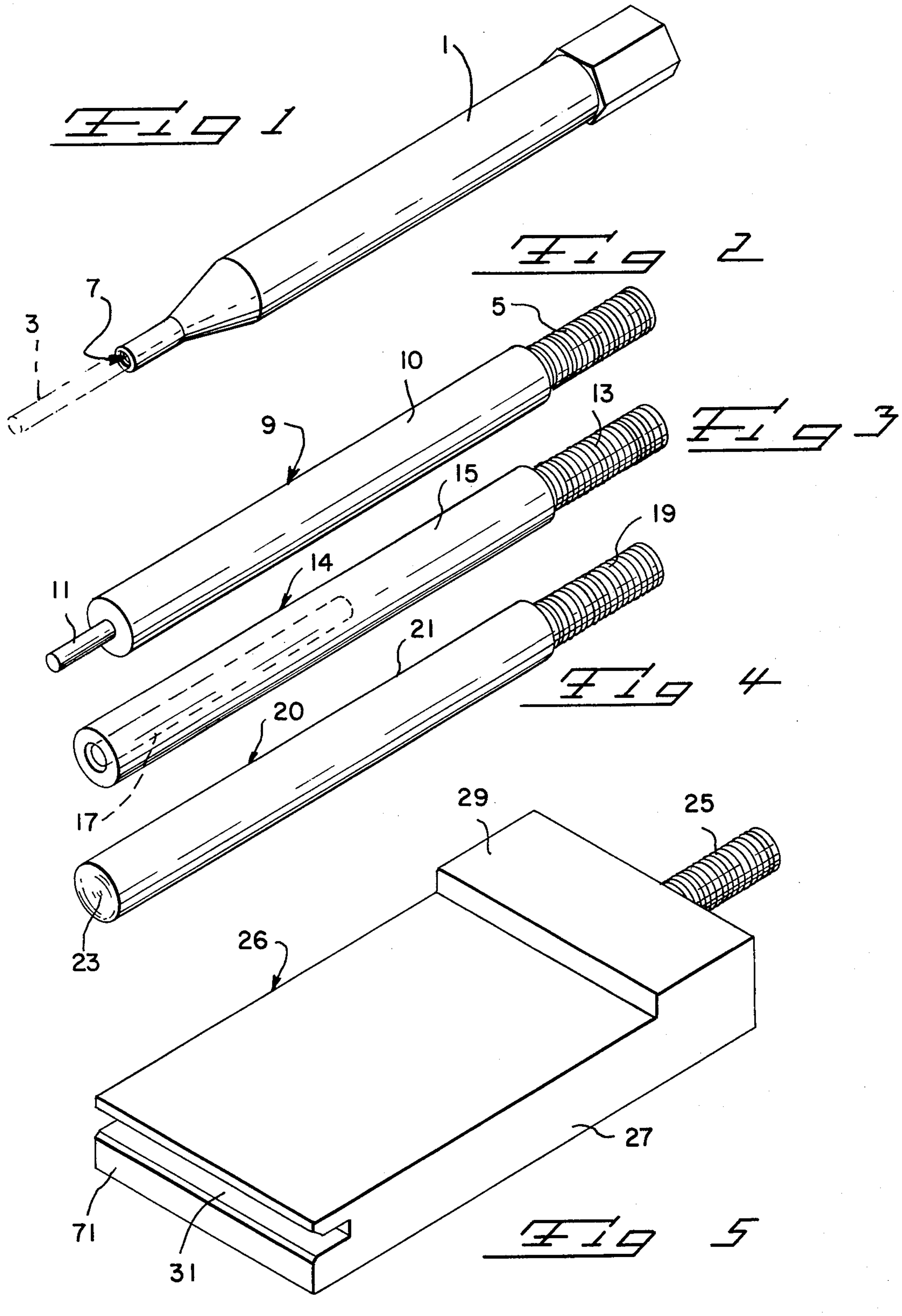
FIG. 1 is a perspective view of an impact tool for receiving an impact tool tip in accordance with the present invention.
FIG. 2 is an enlarged perspective view of a first embodiment of a tool tip for use in the tool of FIG. 1.
FIG. 3 is an enlarged perspective view of a second embodiment of a tool tip for use in accordance with the present invention.
FIG. 4 is an enlarged perspective view of a third embodiment of a tool tip for use in accordance with the present invention.
FIG. 5 is an enlarged perspective view of a fourth embodiment of a tool tip for use in accordance with the present invention.

Referring now to FIG. 1, there is shown an impact tool 1, into which can be threaded a tool tip 3, partially shown in phantom in the threaded groove 7. It should be understood that individual impact tools with nonremovable tips could also be used. The impact tool 1 is of a standard design and provides an impacting force on the tip 3 when operated. Typical prior art impact tool which provide impact are shown in the patents of Han mell (U.S. Pat. No. 2,962,807), Watts (U.S. Pat. No. 2,960,864), Busler (U.S. Pat. No. 2,976,608) and Curtis et al (U.S. Pat. No. 3,135,147). The impact tool itself forms no part of this invention.

A tool tip 3 is threaded into the impact tool of FIG. 1. With reference to FIG. 2, there is shown a first embodiment of a tool tip 9 which includes a threaded portion 5 for threadedly engaging the impact tool 1 in the threaded groove 7 thereof, the tip also including a cylindrical center portion 10 and a reduced cylindrical tip portion 11.

A second embodiment of the invention 14, as shown in FIG. 3, includes a threaded portion 13, a cylindrical center portion 15 and a cylindrical groove 17 extending inwardly from the edge of the tip and within the portion 15 along a predetermined portion of the length of the portion 15 and along the tip axis.

Figure 10:
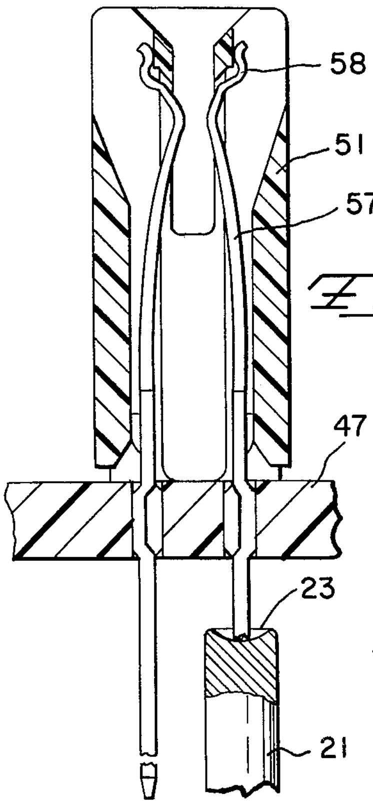
FIG. 10 is a cross-section view of a printed circuit board and connector with pin broken below the printed circuit board and the tool of FIG. 4 in position to partially remove the broken pin.
Figure 11:
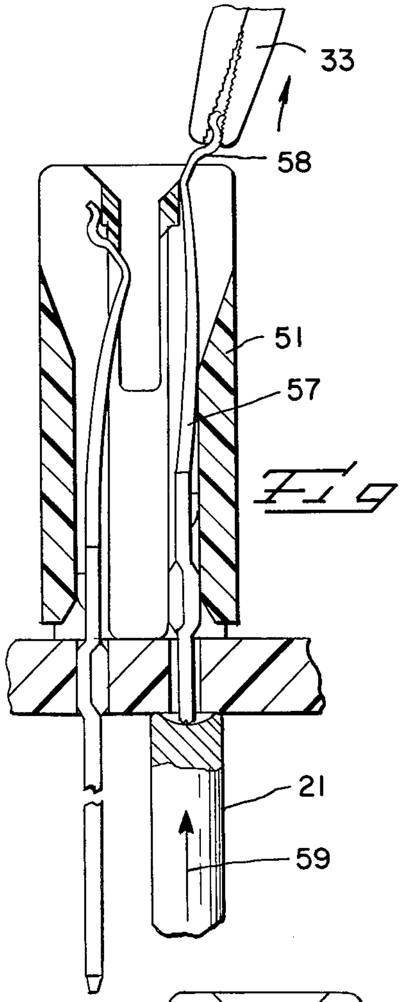
FIG. 11 is a view as in FIG. 10 with the broken pin partially removed.

A third embodiment of a tip 20 is shown in FIG. 4 and includes a threaded portion 19, a cylindrical center portion 21 with the far edge 23 of the cylindrical portion 21 forming a concave spherical depression as best shown in FIGS. 10 and 11.

A fourth embodiment of a tip 26 includes a threaded portion 25 and a solid rectangular portion 27 having a raised step portion 29 at the end adjacent the threaded portion 25 and a rectangular groove 31 at the edge 71 remote from the threaded portion 25.

Figure 6:
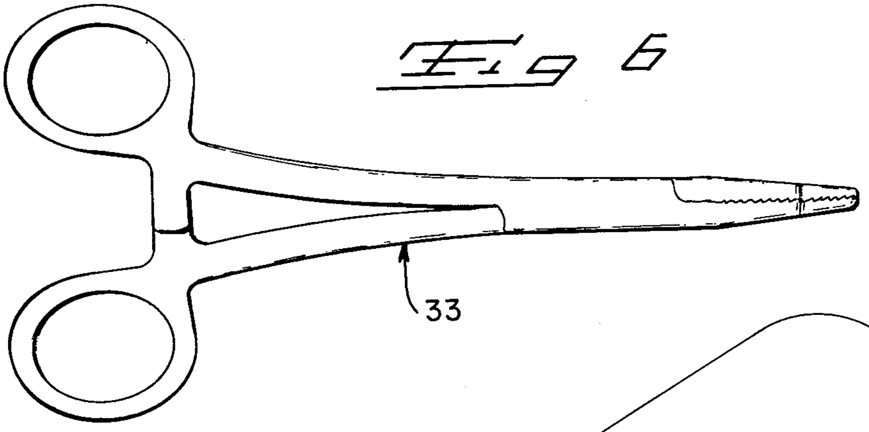
FIG. 6 is a perspective view of a hemostat for use in accordance with the present invention.

Referring to FIG. 6, there is shown a standard hemostat 33 which would be used to remove partially removed connector pins as will be described hereinbelow.

Figure 7:
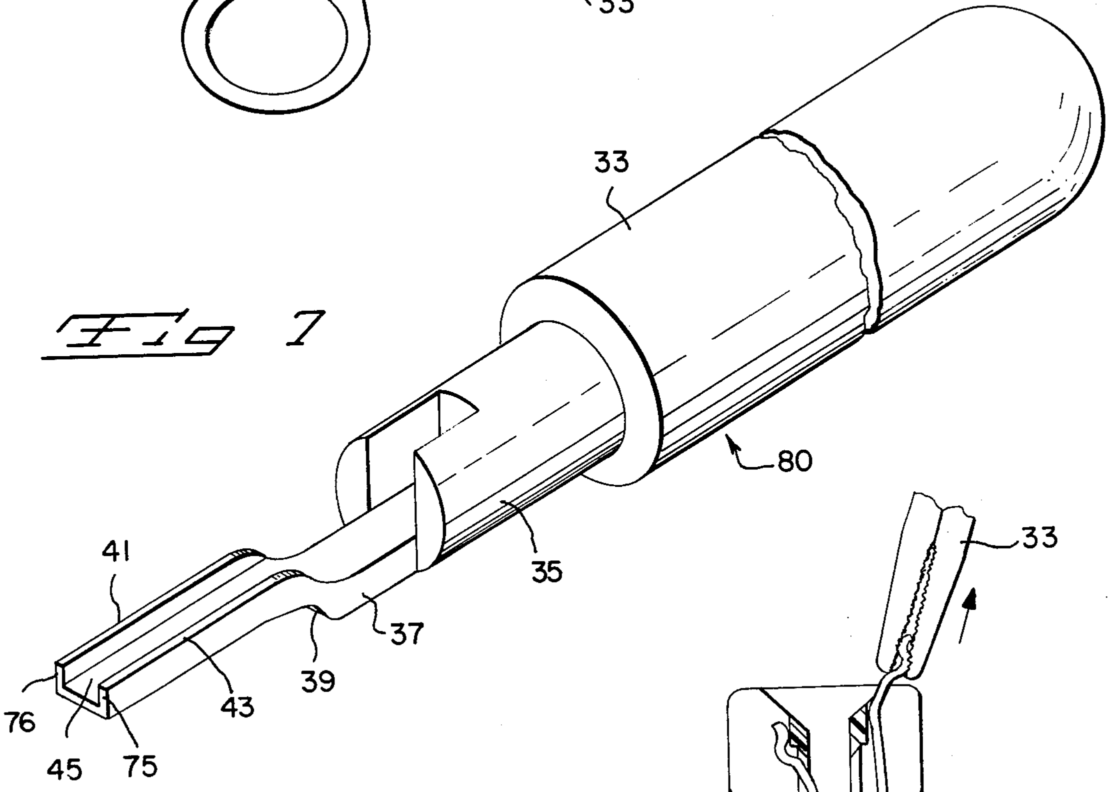
FIG. 7 is a perspective view of a tool for inserting new pins through a housing into a printed circuit board in accordance with the present invention.

Referring now to FIG. 7, there is shown a tool 80 for insertion of connector pins into a housing and printed circuit board. The tool includes a handle portion 33 surrounding a shaft 35 integral therewith and outwardly extending finger 37 of rectangular shape having a ridge or bend 39 therein and, at the downstream portion, a back wall 45 between a pair of upstanding ribs 41 and 43 with downstream edges 76 and 75 respectively.

Figure 8:
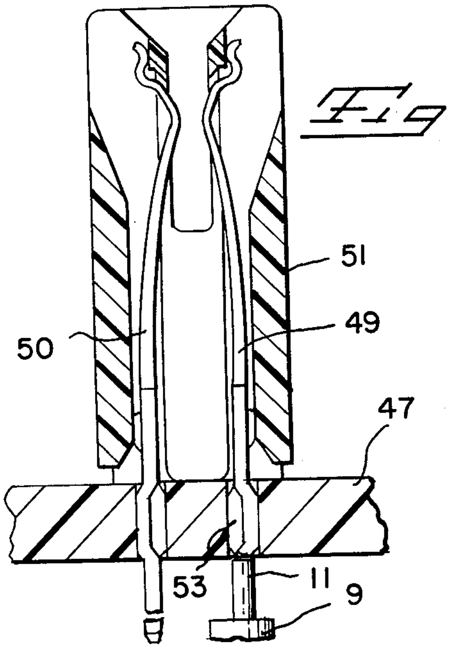
FIG. 8 is a cross section of a connector with pins mounted in a printed circuit board with a pin broken flush with the printed circuit board.
Figure 9:
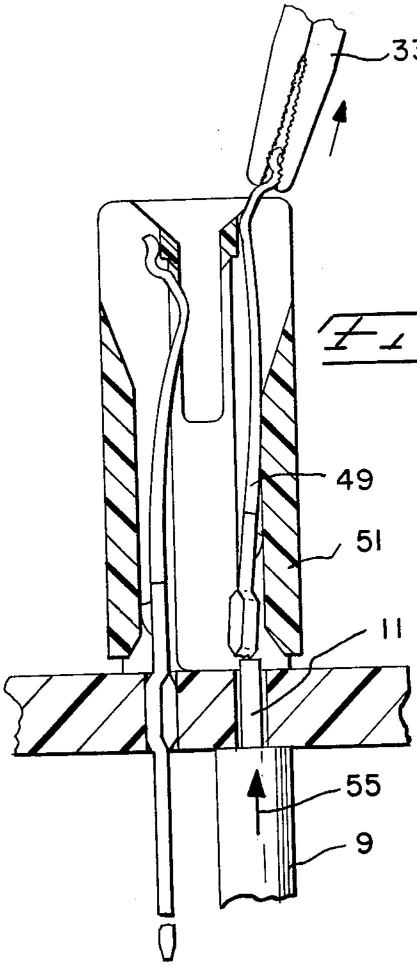
FIG. 9 is a cross section as in FIG. 8 demonstrating pin removal using the tool of FIG. 2.

The extraction of a pin which is broken flush with the bottom of a printed circuit board 47 is shown with respect to FIGS. 8 and 9. As shown in these figures, there is a pin 49 within a housing 51. The pin 49 is half of a connector pin pair 49, 50, there being a row of such connector pin pairs within housing 51 mounted in the printed circuit board 47. The bottom portion of the pin 49 is broken. In order to remove the pin 49, the tool tip of FIG. 2 indicated as 9 with a tip portion 11 is placed in tool 1, the tip portion 11 being positioned at the aperture 53 in the printed circuit board. The impact tool 1 is then operated in an upward motion as shown by the arrow 55 in FIG. 9. The tip 11 moves through the aperture 53 and drives the pin 49 upwardly so that the topmost portion of pin 49 extends out of the housing 51. The pin 49 is then removed from the housing by means of the hemostat 33.

In the event the pin 57, as shown in FIGS. 10 and 11, is broken some distance below the printed circuit board 47, the tip 20 as shown in FIG. 4 would be utilized in the impact tool 1. In this case, as shown in FIG. 10, the concave spherical portion 23 of the tip 21 is positioned against the broken portion of pin 57 and the impact tool is operated to provide the result as shown in FIG. 11. The impact tool moves upwardly as shown by the arrow 59 and drives the pin upwardly so that the topmost portion 58 of the pin 57 extends out of the housing 51 and can be removed by the hemostat 33.

Figure 16:
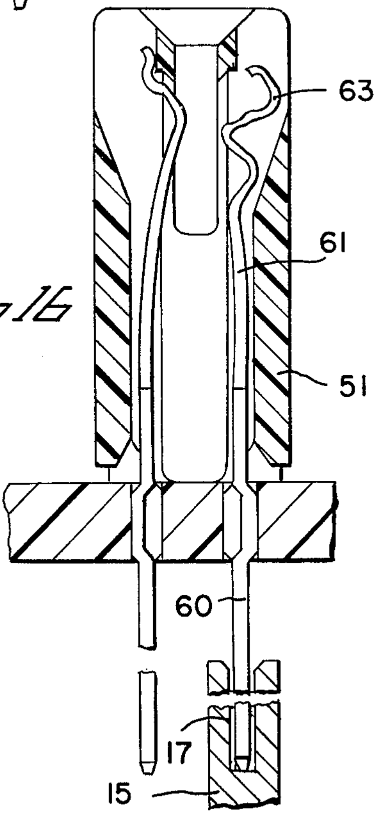
FIG. 16 is a cross-sectional view of an electrical connector and printed circuit board showin pin removal utilizing the tool of FIG. 3.

In the event damage is caused to a portion of the pin 61 (FIG. 16) within the housing as shown by the bent pin portion 63, the tip 14 of FIG. 3 would be used with the impact tool 1. As shown in FIG. 16, the bottommost portion 60 of pin 61 will be positioned in the groove 17 of the tip 14 and the impact tool will be operated to drive the pin 61 upwardly so that the portion 63 extends out of the housing 51 and can then be removed by means of the hemostat 33 as in the prior embodiments.

Referring now to FIG. 17, there is shown a printed circuit board 47 with a housing 51 therein and apertures 65 having tie pins 67 therein. These tie pins are positioned externally of the housing 51 and must be lined up along a single axis. In the event an additional tie pin 67 must be installed, the tip 26 of FIG. 5 is utilized in conjunction with the impact tool of FIG. 1. The tie pin 67 is positioned in the aperture 63 as shown in FIGS. 18 and 19 and the groove 31 is positioned over each of the tie pins 67 in the row so that they all line up along a single axis. The impact tool 1 is then operated to provide a downward force as shown by the arrow 69 in FIG. 20 to move the tie pin 67 downwardly as shown in FIG. 20, so that all of the pins are installed and properly aligned. The ridge 29 can be dimensioned so that it comes in contact with the top portion of the housing 51 when the tie pin 67 is driven into its proper position to prevent excess driving force being applied to the tie pins 67. In addition, the groove 31 can be dimensioned so that the body portion edge 71 of the tip 26 contacts the printed circuit board 47 when the tie pins 67 are fully inserted.

Figure 12:
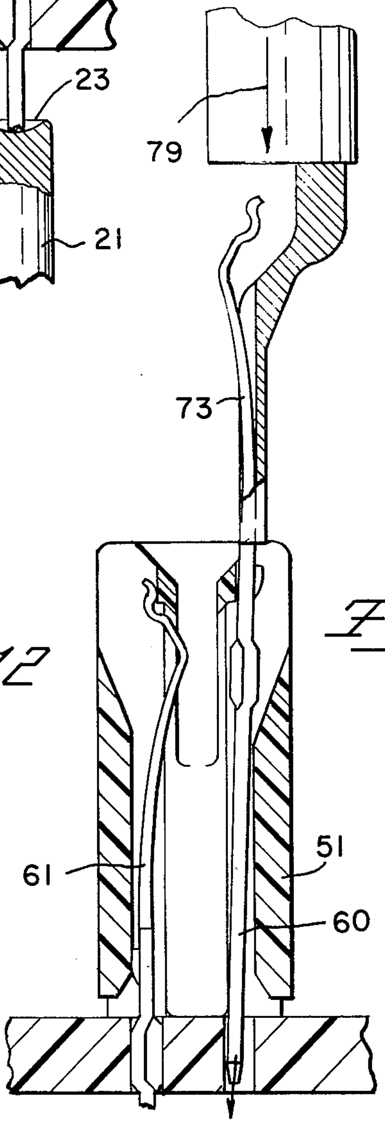
FIG. 12 is a cross-sectional view of an electrical connector with the tool of FIG. 7 with a connector pin partially inserted into the housing and printed circuit board.
Figure 13:
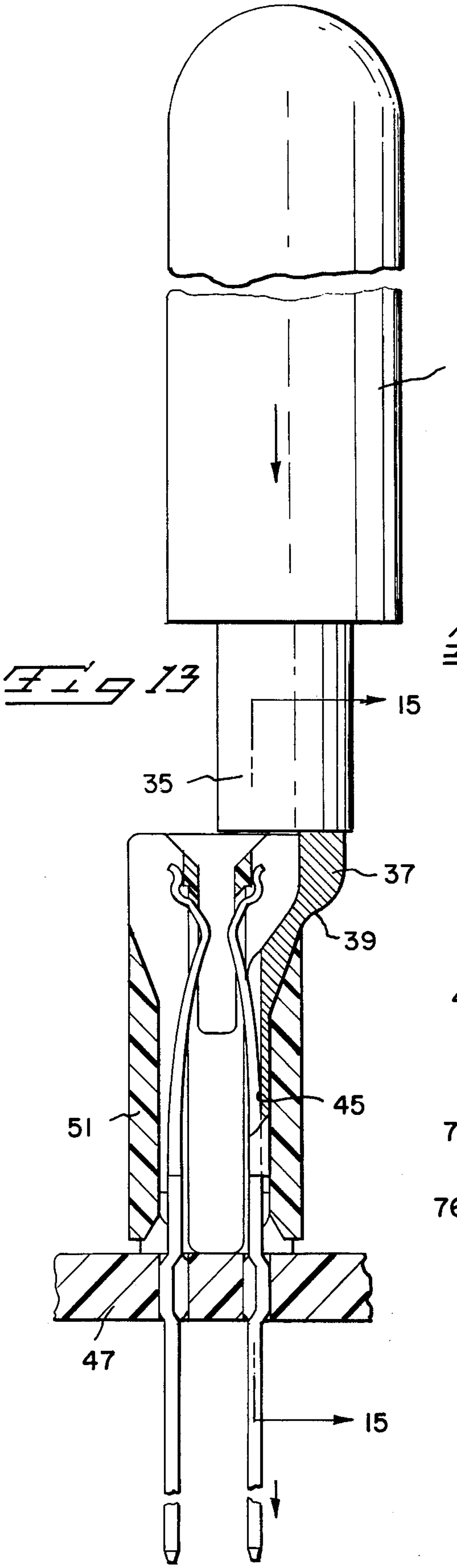
FIG. 13 is a view as in FIG. 12 showing the pin completely inserted into the printed circuit and housing.
Figure 14:
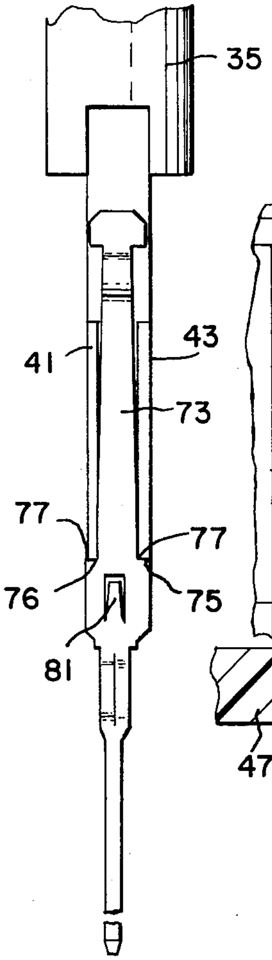
FIG. 14 is a plan view of the tool and pin showing the tool in greater detail.
Figure 15:
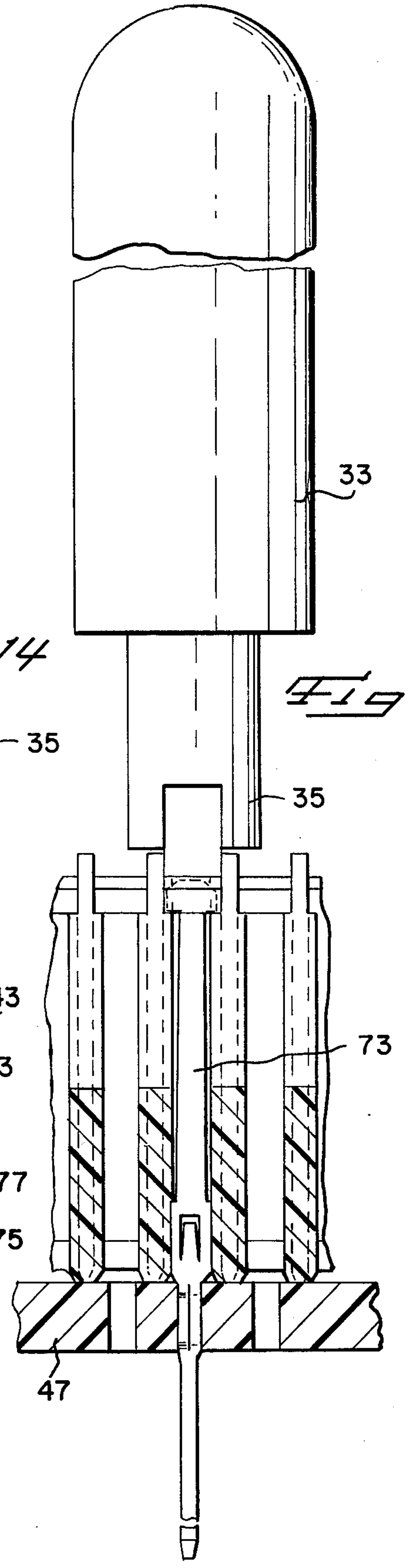
FIG. 15 is a view taken along the line 15—15 of FIG. 13.

Insertion of pins into the printed circuit board 47 through housing 51 is best shown in conjunction with FIGS. 12 to 15 utilizing the tool as shown in FIG. 7. In order to install a pin 73, the pin is positioned in the tool 80 as shown in FIG. 14 wherein the lower ends 75 and 76 of the upstanding ribs 41 and 43 contact the flanges 77 of the pin 73. The upper portion of the pin 73 rests in the groove formed by back wall 45 and upstanding ribs 41 and 43. The pin 73 is therefore secured within the tool of FIG. 7 and is forced downwardly through the housing as shown in FIG. 12 by the arrow 79, the tool 80 continuing downwardly within the housing as shown in FIGS. 13 and 15 until the tool handle 33 and its shaft portion 35 bottom on the top surface of the housing 51. At this point, the locking tyne members 81 of the pin 73 will have locked into the circuit board 47 and the pin will be properly position therein. Due to the locking operation of the tyne members 81, the tool can now be pulled upwardly and removed from the connector housing with the pin 73 in place.

It can be seen that there has been provided a tool set for extracting and inserting electrical connector pins from and into a printed circuit board without requiring housing removal or an excessive number of tools.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A tool for forcing an elongated electrical contact pin into an aperture in a printed circuit board through the upper end of a housing mounted on said board, said tool comprising an elongated member provided with a channel portion at one end, a handle portion at the opposite end and an intermediate shaft portion which is wider than the channel portion, said pin having a first section of dimensions to be frictionally retained within said aperture, a second section providing oppositely extending shoulders and a flat spring-like section substantially the width of the channel in the tool, the distance between the free end of the channel and the most adjacent part of the shaft being such that the widened end of the shaft abuts the top edge of the housing when the springlike sections of the pin lies within the channel of the tool, the free end of the channel abuts the shoulders on the pin and said first section of the pin is nested within the aperture.

2. A tool according to claim 1 wherein the shaft and handle portions are offset but parallel to the channel portion.

* * * * *